US006998923B2

(12) United States Patent
Melanson

(10) Patent No.: US 6,998,923 B2
(45) Date of Patent: Feb. 14, 2006

(54) LOW-NOISE LOOP FILTER FOR A PHASE-LOCKED LOOP SYSTEM

(75) Inventor: John L. Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 111 days.

(21) Appl. No.: 10/665,164

(22) Filed: Sep. 18, 2003

(65) Prior Publication Data
US 2005/0062550 A1      Mar. 24, 2005

(51) Int. Cl.
*H03L 7/00*      (2006.01)
(52) U.S. Cl. .......................... 331/17; 331/16; 327/156; 327/157
(58) Field of Classification Search .................. 331/17, 331/34, 16; 327/156, 157
See application file for complete search history.

(56) References Cited

U.S. PATENT DOCUMENTS

| 4,205,277 A | * | 5/1980 | Poinas ......................... 331/12 |
| 6,229,361 B1 | | 5/2001 | Henwood |
| 6,690,240 B1 | | 2/2004 | Maxim et al. |

OTHER PUBLICATIONS

Young et al., "A PLL Clock Generator with 5 to 110 MHz of Lock Range for Microprocessors," J. Solid-State Cir., 27(11):1599-1607, Nov. 1992.
Maneatis, J.G., "Low-Jitter Process-Independent DLL and PLL Based on Self-Biased Techniques," J. Solid-State Cir., 31(11):1723-1732, Nov. 1996.
Mijuskovic et al., "Cell-Based Fully Integrated CMOS Frequency Synthesizers," J. Solid-State Cir., 29(3):271-279, Mar. 1994.
Novof et al., "Fully Integrated CMOS Phase-Locked Loop with 15 to 240 MHz Locking Range and ±50ps Jitter," J. Solid-State Cir., 30(11):1259-1266, Nov. 1995.
Lee and Kim, "A Low-Noise Fast-Lock Phase-Locked Loop with Adaptive Bandwidth Control," J. Solid-State Cir., 35 (8):1137-1145, Aug. 2000.
Lin et al., "A 1.4 GHz Differential Low-Noise CMOS Frequency Synthesizer Using a Wideband PLL Architecture," ISSCC Dig. Tech. Papers, San Francisco, CA, Feb. 2000, pp. 147-149.
Rhee, W., "Design of High Performance CMOS Charge-Pumps in Phase Locked Loops," Proc. IEEE Int. Symp. Circuits and Systems, Orlando, FL, May 1999, pp. II.545-II.548.
Maxim et al., "A Low Jitter 125-1250 Mhz Process Independent 0.18 μm CMOS PLL Based on a Sample-Reset Loop Filter," ISSCC Dig. Tech. Papers, San Francisco, CA, Feb. 2001, pp. 394-395.

(Continued)

*Primary Examiner*—Arnold Kinkead
(74) *Attorney, Agent, or Firm*—Steven Lin, Esq.

(57) ABSTRACT

A loop filter device and method for a phase locked loop ("PLL") circuit, which locks a frequency of a signal to a reference frequency, are disclosed. The loop filter includes an integral path circuit and a new proportional path circuit cascaded together in series and further includes a summer. The integral path circuit integrates a loop filter input signal to provide an integrated signal that tracks an overall input signal level. The new proportional path circuit differentiates the integrated signal to provide a proportional signal based on a detected instantaneous phase difference for locking a frequency of a signal for a phase locked loop (PLL) circuit to a reference frequency. The summer receives as inputs and sums the integrated signal and the proportional signal to provide a low-noise loop filter output signal.

21 Claims, 5 Drawing Sheets

OTHER PUBLICATIONS

Maxim and Maxim, "A Novel Physical Model of Deep-Submicron CMOS Transistor Mismatch for Monte Carlo SPICE Simulation," Proc. IEEE Int. Symp. Circuits and Systems, Sidney, NSW, Australia, May 2001, pp. V.511-V.514.

Maxim et al., "Sample-reset Loop Filter Architecture for Process Independent and Ripple-Pole-Less Low Jitter CMOS Charge Pump PLL's," ISCAS 2001, 2001 IEEE Int. Symp., 4:766-769, May 6-9, 2001.

* cited by examiner

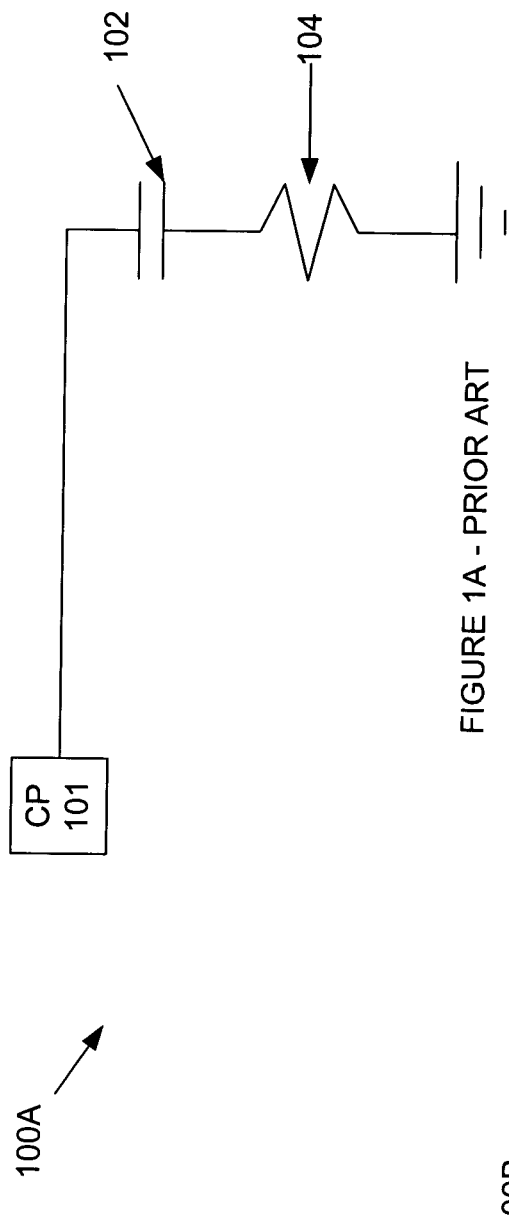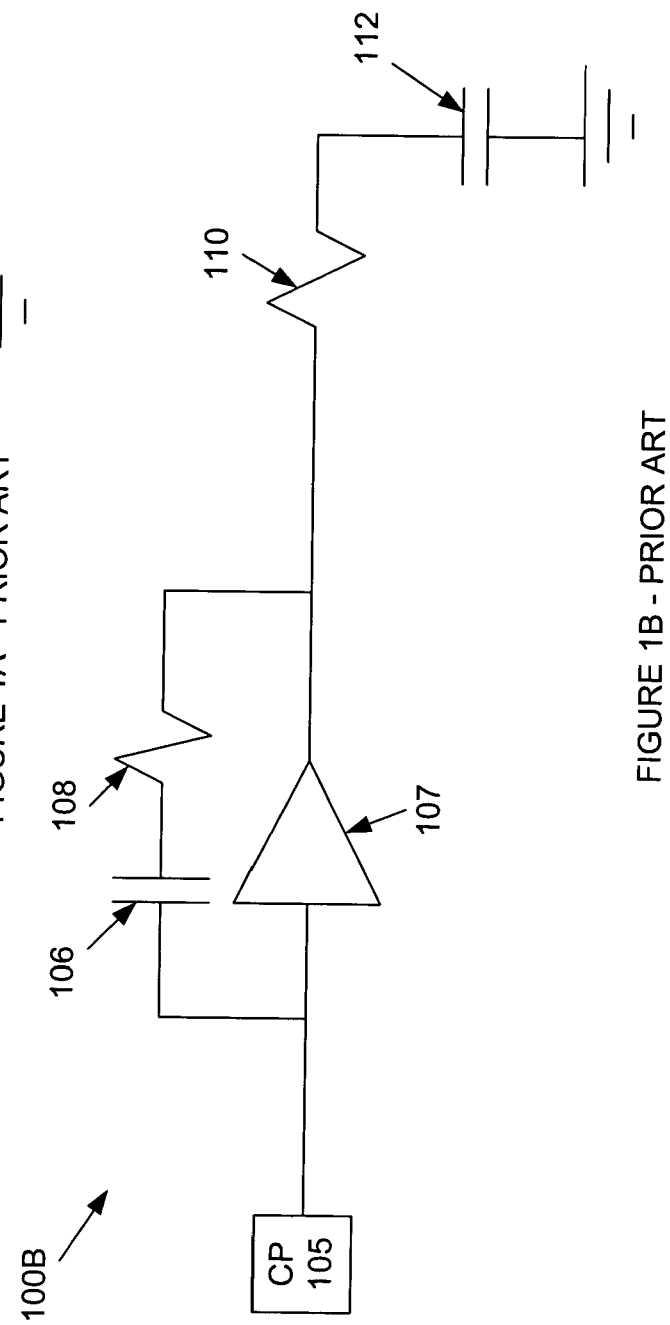
FIGURE 1A - PRIOR ART
FIGURE 1B - PRIOR ART

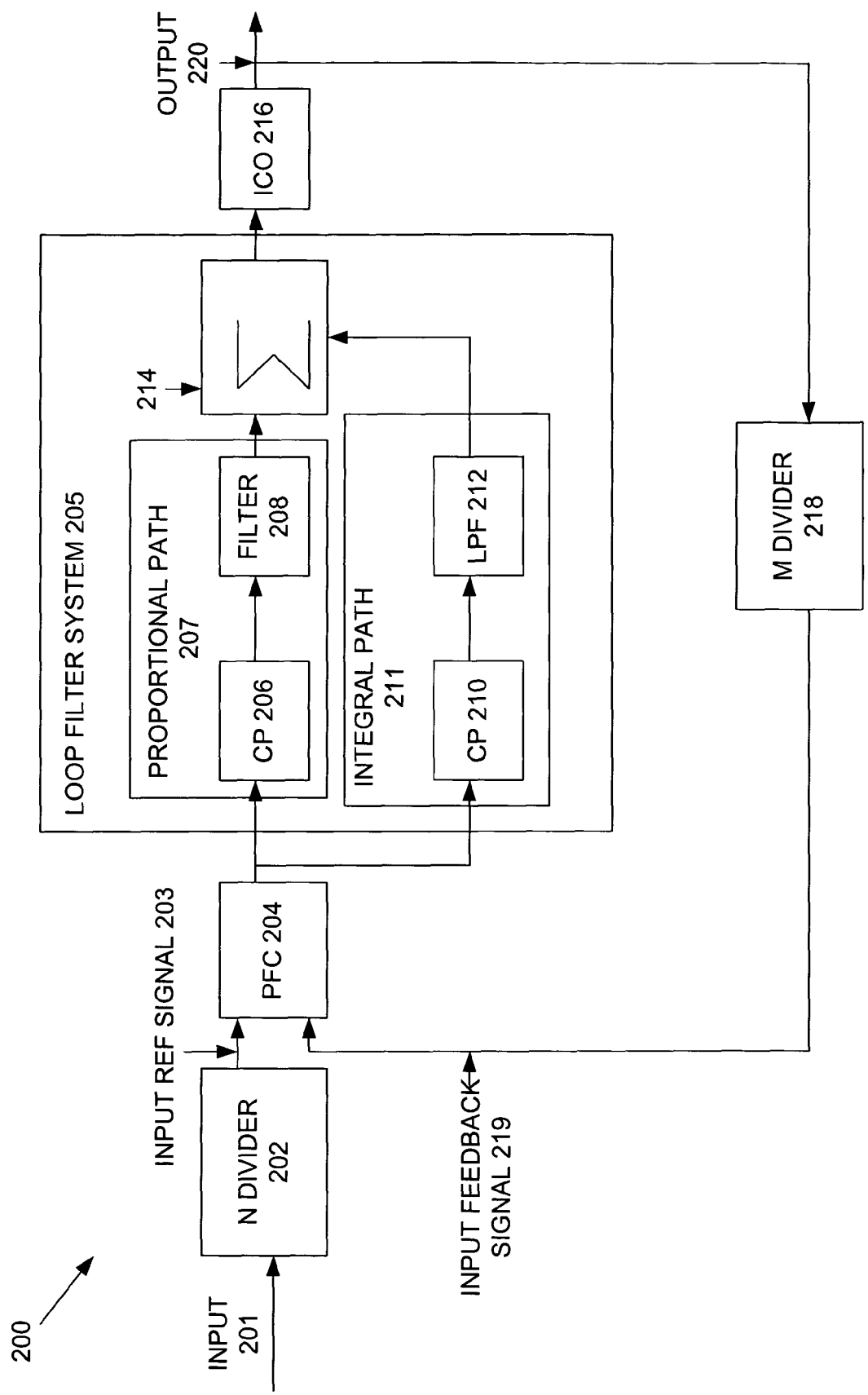
FIGURE 2 - PRIOR ART

LOW-NOISE LOOP FILTER FOR A PHASE-LOCKED LOOP SYSTEM

BACKGROUND OF THE INVENTION

1. Field of the Invention

The present invention relates to phase-locked loop ("PLL") circuits, and, more particularly, to a loop filter for a PLL circuit. More specifically, the present invention relates to a low-noise loop filter for a PLL circuit.

2. Description of Related Art

A phase-locked loop ("PLL") circuit generally includes a phase detector, a loop filter, and a controlled oscillator. The phase detector receives an input signal, which has a reference frequency. The output signal of the controlled oscillator is fed back to the phase detector. The frequency of the output signal is typically a multiple of the reference frequency of the input signal. The PLL circuit is utilized to lock the output frequency to the input frequency. Locking the output frequency to the input reference frequency is critical in various applications, such as developing accurate and precise clocks for digital signal processors ("DSPs") and for audio sampling frequencies and rates. Fast locking applications also exist in which adaptive bandwidth PLLs have been developed and used.

PLL circuits in mixed-signal integrated circuit designs typically operate in noisy environments. Much of the noise is introduced through the current or voltage supplies, the substrate, temperature variations, process parameters, or other such sources. Low jitter PLL circuits require high loop bandwidths to reject the noise.

Passive loop filters for PLL circuit designs are popular due to their simplicity, but the control of their loop time constants lacks flexibility. Active loop filters used in conjunction with feed-forward charge pumps provide a wider range of loop time constants and often provide a decreased area of on-chip capacitance. Fully differential charge pumps for PLL circuit designs have been of great interest due to their ability to reject noise. However, fully differential charge pumps require increased on-chip capacitance and extra circuitry for common mode feedback. One drawback of a charge pump PLL circuit is that setting the loop filter pole position requires a compromise between the loop phase margin and the jitter performance.

Typical charge pump PLL circuits having two poles at the origin require a zero to be introduced in the loop for stability. A common method of adding a zero is to couple a resistor in series with the charge pump capacitor. FIG. 1A shows a loop filter 100A according to the prior art in which a resistor is coupled in series with a charge pump capacitor to provide stability. Loop filter 100A includes a charge pump (CP) 101 with a current output, a charge pump capacitor 102, and a resistor 104. CP 101 is coupled to charge pump capacitor 102, and charge pump capacitor 102 is, in turn, coupled to resistor 104. Resistor 104 is further coupled to ground.

Another common method of adding a zero is to use an op-amp virtual ground technique. FIG. 1B shows another loop filter 100B according to the prior art. Loop filter 100B has a charge pump 105, a capacitor 106, an amplifier 107, a resistor 108, a filtering resistor 110, and a filtering capacitor 112. Capacitor 106 and resistor 108 are coupled together in series and along a feed-back path of amplifier 107. Filtering resistor 110 and filtering capacitor 112 are coupled in series between amplifier 107 and ground and further filter the output from amplifier 107. This higher-frequency pole is commonly added to improve the loop noise characteristics at some expense to loop stability.

Most charge pump PLLs use a proportional signal that is based on the instantaneous time difference. The signal in lock is characterized by narrow high amplitude pulses, that even after filtering, lead to an abrupt variation of the oscillator control signal and rapid frequency changes that degrade the jitter performance of the PLL circuit. Typical charge pump loop filters each involves a small period of time in which most of the loop filtering actions, such as transients, charge sharing, charge injection, etc., occurs. Additionally, the output of a charge pump loop filter is generally a sum of the integral of the phase error or difference and a proportionate term. The charge pump loop filter typically has another one-pole filter that helps remove high frequency "noise", but the addition of this other one-pole filter negatively affects the phase response of the closed loop.

A solution to this "other one-pole filter" problem has been proposed in U.S. patent application Ser. No. 10/043,558 filed on Jan. 10, 2002 which has issued as U.S. Pat. No. 6,690,240 on Feb. 10, 2004, and in U.S. continuation patent application Ser. No. 10/612,200 filed on Jul. 3, 2003. which issued as U.S. Pat. No. 6,825,864 filed on Dec. 7, 2004, which both are entitled "LOW-JITTER LOOP FILTER FOR A PHASE-LOCKED LOOP SYSTEM" by Adrian Maxim, Baker Scott III, Edmund M. Schneider, and Melvin L. Hagge (hereafter "the Maxim reference"). The solution in the Maxim reference generally proposes separating the proportionate terms from the integral terms within the loop filter. By separating the proportionate and integral terms, some optimizations for the PLL circuit are able to be achieved.

With reference now to FIG. 2, an exemplary phase-locked loop ("PLL") circuit 200 according to the Maxim reference is shown. PLL circuit 200 includes a phase frequency comparator ("PFC") 204, a loop filter system 205 that includes a current adder ("Σ") 214, and a current controlled oscillator ("ICO") 216 coupled together in series. An N divider 202 is coupled to a positive input node of PFC 204. An M divider 218 is coupled to the output of ICO 216, and the output of M divider 218 is coupled and fed back to a negative input node of PFC 204. An input signal 201 is fed into N divider 202 and divides input signal 201 by a factor of N to provide input reference signal 203. The N-divided input reference signal 203 is fed as an input signal into PFC 204. Furthermore, an output signal 220 of PLL circuit 200 is fed into an M divider 218 as shown in FIG. 2. M divider 218 divides output signal 220 by a factor of M to provide an input feedback signal 219. The M-divided input feedback signal 219 is fed back as an input signal into the negative input node of PFC 204.

Loop filter system 205 has a separate proportional signal path 207 and a separate integral signal path 211. Proportional signal path 207 includes a charge pump ("CP") 206 coupled in series with a loop filter device ("filter") 208. The output of PFC 204 is coupled to the input of CP 206, and the output of CP 206 is coupled to the input of filter 208. The output of filter 208 is then fed into current adder 214. Integral signal path 211 has another charge pump ("CP") 210 coupled in series with another loop filter device ("LPF") 212. The output of PFC 204 is coupled to the input of CP 210, and the output of CP 210 is coupled to the input of LPF 212. The output of LPF 212, in turn, is fed into current adder 214.

However, the component structures and operations of proportional path 207 and integral path 211 can be fairly complex and involved. For example, proportional path 207 and integral path 211 each utilizes its own respective CP 206 and 210. Furthermore, filter 208 of proportional path 207 can include a transconductance stage, various capacitors, and a series of hold and reset switches for the capacitors and charge pumps. LPF 212 of integral path 211 can include a loop filter stage having a capacitor, a transistor, and a resistor. The complexity of proportional path 207 and integral path 211 places certain circuit constraints on the loop filter and PLL circuit and can contribute to poor transient behavior by the loop filter.

The present invention recognizes the desire and need for further reducing the noise and jitter in a PLL circuit. The present invention further recognizes the desire and need to simplify the components for the proportional path and integral path of a loop filter for a PLL circuit. The present invention also recognizes the desire and need to relieve circuit constraints and improve transient behavior for a loop filter of a PLL circuit. The present invention overcomes the problems and disadvantages in accordance with the prior art.

SUMMARY OF THE INVENTION

A loop filter device and method for a phase locked loop ("PLL") circuit, which locks a frequency of a signal to a reference frequency, are disclosed. The loop filter includes an integral path circuit and a new proportional path circuit cascaded together in series and further includes a summer. The integral path circuit integrates a loop filter input signal to provide an integrated signal that tracks an overall input signal level. The new proportional path circuit differentiates the integrated signal to provide a proportional signal based on a detected instantaneous phase difference for locking a frequency of a signal for a phase locked loop (PLL) circuit to a reference frequency. The summer receives as inputs and sums the integrated signal and the proportional signal to provide a low-noise loop filter output signal.

BRIEF DESCRIPTION OF THE DRAWINGS

The novel features believed characteristic of the invention are set forth in the appended claims. The invention itself, however, as well as a preferred mode of use, further objects and advantages thereof, will best be understood by reference to the following detailed description of an illustrative embodiment when read in conjunction with the accompanying drawings, wherein:

FIG. 1A is a block diagram of an exemplary loop filter for a phase-locked loop (PLL) circuit according to the prior art in which a resistor is coupled in series with a charge pump capacitor;

FIG. 1B is a block diagram of an exemplary loop filter for a phase-locked loop (PLL) circuit according to the prior art in which a feed-forward technique is used;

FIG. 2 is a block diagram of an exemplary PLL circuit according to the prior art in which the proportional and integral paths for the loop filter are separated;

DETAILED DESCRIPTION OF THE INVENTION

A loop filter device and method for a phase locked loop ("PLL") circuit, which locks a frequency of a signal to a reference frequency, are disclosed. The loop filter includes an integral path circuit and a new proportional path circuit cascaded together in series and further includes a summer.

It is well known in the art that signals for a PLL circuit can be either voltage signals or current signals. Conversion between the voltage and current domains can be performed. Therefore, a PLL circuit could be described as a system having either a respective voltage or current mode filter and either a respective voltage or current controlled oscillator.

Figure 3:
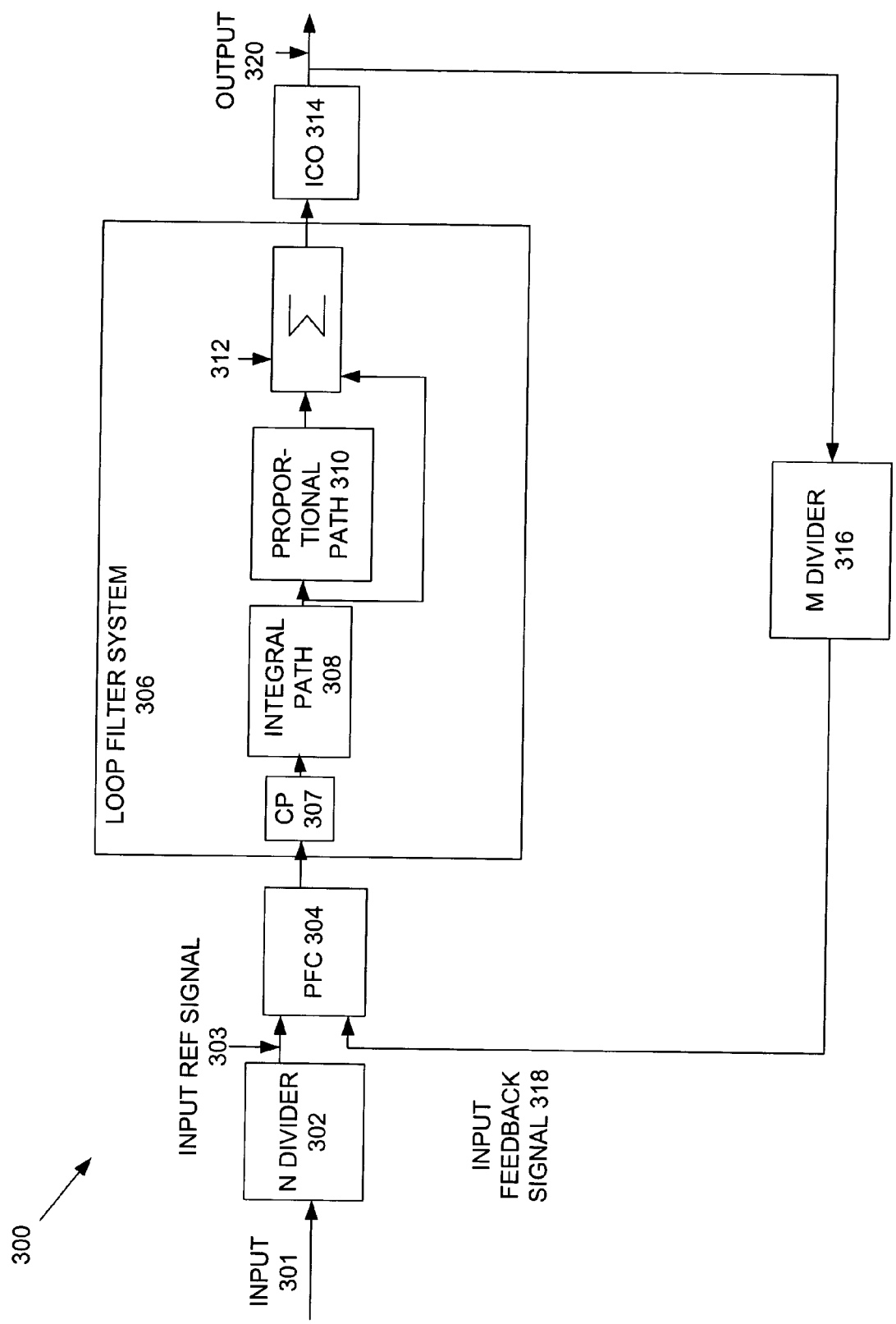
FIG. 3 is a block diagram of an exemplary phase-locked loop circuit having a loop filter system according to the present invention.

With reference now to FIG. 3, an exemplary phase-locked loop ("PLL") circuit 300 according to the present invention is shown. PLL circuit 300 includes a phase frequency comparator ("PFC") 304, a loop filter system 306 that includes a current summer ("Σ") 312, and a current controlled oscillator ("ICO") 314 coupled together in series. An N divider 302 is coupled to a positive input node of PFC 304. An M divider 316 is coupled to the output of ICO 314, and the output of M divider 316 is coupled and fed back to a negative input node of PFC 304. An input signal 301 is fed into N divider 302 and divides input signal 301 by a factor of N to provide input reference signal 303. The N-divided input reference signal 303 is fed as an input signal into PFC 304. Furthermore, an output signal 320 of PLL circuit 300 is fed into an M divider 316 as shown in FIG. 3. M divider 316 divides output signal 320 by a factor of M to provide an input feedback signal 318. The M-divided input feedback signal 318 is fed back as an input signal into the negative input node of PFC 304.

Loop filter system 306 has a charge pump ("CP") 307, an integral path circuit 308, a new proportional path circuit 310, and summer 312 coupled together in series as shown in FIG. 3. The output of PFC 304 is coupled to the input of CP 307, and the output of CP 307 is coupled to the input of integral path circuit 308. The output of integral path circuit 308 is coupled to the input of proportional path circuit 310, and the output of integral path circuit 308 is also fed as one of the inputs into summer 312. The output of proportional path circuit 310 is further fed as another input into summer 312.

PFC 304 compares the frequencies or phases of input reference signal 303 and feedback signal 318. PFC 304 generates and outputs a phase error signal based on the comparison and phase differences of the frequencies or phases. The phase error signal is fed into loop filter system 306. The phase error signal is the difference in phase between what the phase of the signal currently is (e.g., phase of feedback signal 318) and what the phase of the signal should be (e.g., phase of the input reference signal 303).

The phase error signal is passed to CP 307. CP 307 generates a current value (e.g., charge stream) based on the phase error signal. Integral path circuit 308 integrates the current signals to provide integrated output signals. Integral path circuit 308 performs the integrations by creating weighed sums or integrals over all past and present outputs from CP 307. Thus, the output of integral path circuit 308 includes memory of phase error signals for various prior update periods as well as a component attributed to the present update. The integrated output signal from integral path circuit 308 is fed as one input into summer 312.

Proportional path circuit 310 is cascaded in series with integral path circuit 308. Proportional path circuit 310 also receives the integrated output signal from integral path circuit 308. Proportional path circuit 310 differentiates the integrated output signal to provide a proportional signal. The proportional signal is recovered from the integrated output signal by way of differentiation. The proportional signal is fed as another input signal into summer 312. Summer 312 adds the integrated output signal, which reflects an overall current level, and the proportional (current) signal together to output a control current that tunes the phase of output signal 320 based on the control current. The control current is input into ICO 314 to provide a low-noise loop filter output signal 320 having an output phase that the loop feedback will lock in phase with the reference phase of input reference frequency 301.

Thus, integral path circuit 308, proportional path circuit 310, and summer 312 are coupled together in series in a single cascaded path. The loop filter input signal (through CP 307) is fed into and integrated by integral path circuit 308 to provide an integrated output signal. Integrated output signal is inputted into and differentiated by proportional path circuit 310 to provide the proportional signal. The integrated output signal and the proportional signal are summed together by summer 312. The output signal of summer 312 is fed into ICO 314 to provide the low-noise loop filter output signal 320. PLL circuit 300 only has a single charge pump, CP 307, and CP 307 is driven into the easiest possible load (e.g., an integrating capacitor CINT).

Figure 4:
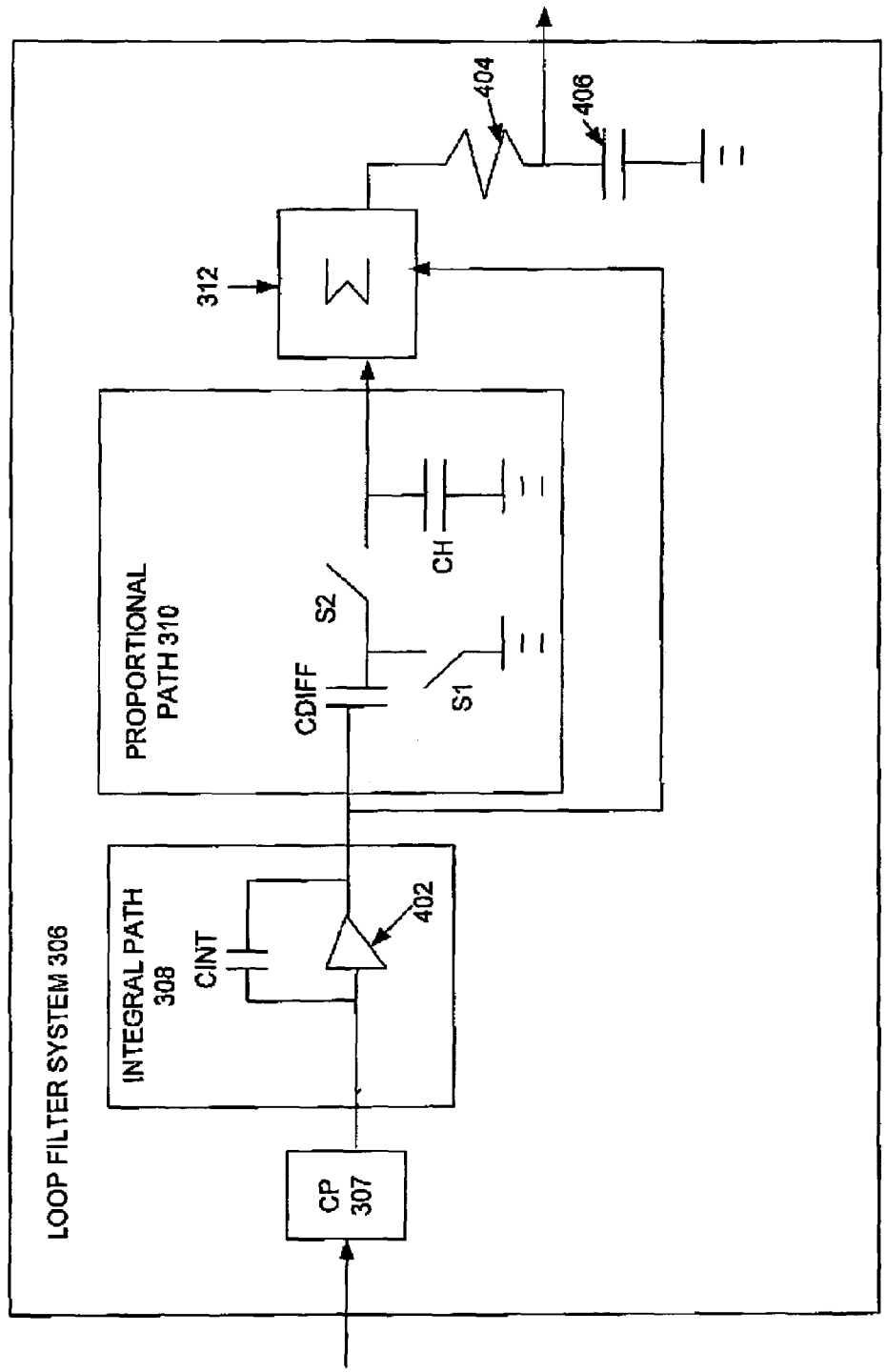
FIG. 4 is a block diagram of an exemplary loop filter system in the phase-locked loop circuit of FIG. 3 according to the present invention.

Referring now to FIG. 4, an exemplary circuit block diagram of loop filter system 306 of FIG. 3 according to the present invention is illustrated. FIG. 4 shows loop filter system 306 with integral path circuit 308 and proportional path circuit 310 cascaded together in series. As stated earlier, loop filter system 306 further has CP 307 and summer 312. Loop filter system 306 further has a filter that includes a filtering resistor 404 and a filtering capacitor 406 coupled between the output of loop filter system 306 and ground as shown in FIG. 4. The filter further performs filtering operations on the output of loop filter system 306 to provide the low-noise loop filter output signal 320.

Integral path circuit 308 includes an amplifier 402 and an integrating capacitor CINT coupled in parallel with amplifier 402 as shown in FIG. 4. Proportional path circuit 310 has a differentiating capacitor CDIFF, a first switch S1, a second switch S2, and a holding capacitor CH. Differentiating capacitor CDIFF and second switch S2 are coupled together in series between integral path circuit 308 and summer 312 as shown in FIG. 4. One end of first switch S1 is coupled to a node between differentiating capacitor CDIFF and second switch S2, and the other end of first switch S1 is coupled to ground. Furthermore, one end of holding capacitor CH is coupled to a node between second switch S2 and summer 312, and the other end of holding capacitor CH is coupled to ground.

Operations of proportional path circuit 310 are described as follows. First switch S1 is activated, and second switch S2 is deactivated. Activation of first switch S1 causes the integrated output signal from integral path circuit 308 to flow through differentiating capacitor CDIFF. Differentiating capacitor CDIFF is charged up based on the integrated output signal received. Next, switch S1 is deactivated. After the active state of the charge pump has finished, activation of second switch S2 causes holding capacitor CH to charge up the difference of the input signal, in which the charge is, in effect, the proportional signal. Holding capacitor CH holds the charge of differentiating capacitor CDIFF for inputting the proportional signal into summer 312 and provides an additional high-frequency pole. The respective activation and de-activation of first switch S1 and second switch S2 are repeated for differentiating various integral output signals from integral path circuit 308 to provide corresponding proportional signals.

Figure 5:
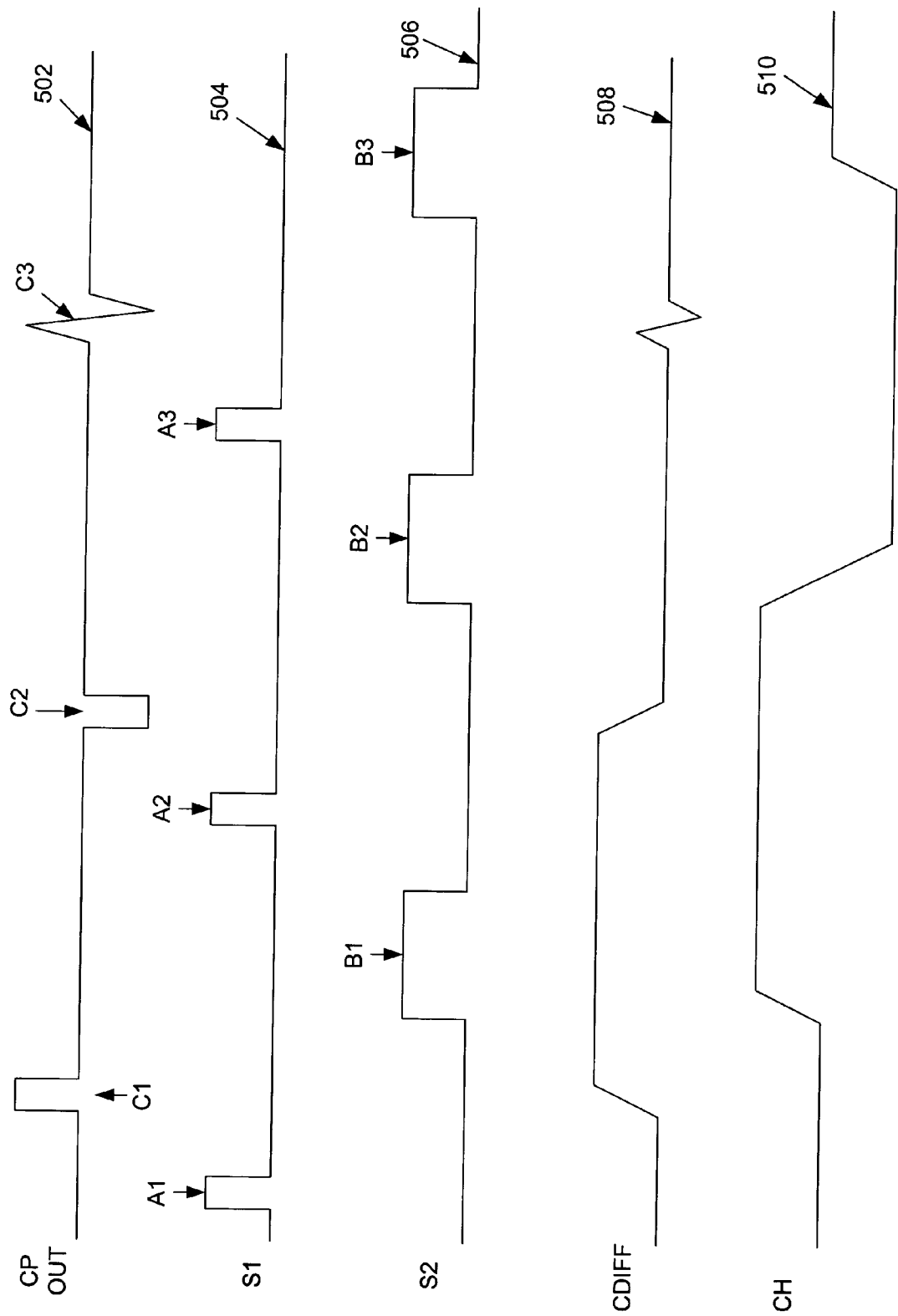
FIG. 5 is a set of exemplary timing diagrams for signals of the integral path circuit and proportional path circuit of the loop filter system in FIG. 4 according to the present invention.

With reference now to FIG. 5, exemplary timing diagrams 502, 504, 506, 508 and 510 of signals for proportional path circuit 310 of loop filter system 306 in FIGS. 3 and 4 according to the present invention are shown. Timing diagram 502 shows charge pump output CP OUT at various times C1 to C3. Timing diagram 504 further shows activation signals at various times A1 to A3 for first switch S1, and timing diagram 506 also shows activation signals at other various times B1 to B3 for second switch S2. Timing diagram 508 also shows the charge signals for differentiating capacitor CDIFF over the various activation times A1 to A3 of first switch S1. Timing diagram 510 further shows the charge signals for holding capacitor CH over the various activation times B1 to B3 for second switch S2.

At time A1, first switch S1 is activated, and second switch S2 is de-activated. At time C1 which occurs after time A1, charge pump 307 outputs a positive amount of charge as charge pump output CP OUT. Differentiating capacitor CDIFF starts charging up at time C1, and the charge signal level of differentiating capacitor CDIFF settles at a high value. At time B1, which is after the occurrence of charge pump output CP OUT at time C1, first switch has already been deactivated and second switch S2 is activated. When second switch S2 is activated, holding capacitor CH then begins to charge up by receiving charge that is transferred from differentiating capacitor CDIFF. The charge signal level of holding capacitor CH settles at a high value. At time A2 which occurs after time B1, first switch S1 is again activated while second switch S2 has already been deactivated. At time C2 which occurs after time A2, charge pump 307 outputs a negative amount of charge as charge pump output CP OUT. The charge signal level of differentiating capacitor CDIFF then begins to discharge at time C2.

At time B2 which occurs after time C2, first switch S1 has already been de-activated while second switch S2 is further activated. The charge signal level of differentiating capacitor CDIFF is settled at the zero value. The charge signal level of holding capacitor CH then falls from a positive value to a negative value. At time A3 which occurs after time B2, first switch S1 is again activated and second switch S2 has already been de-activated. The charge signal level of differentiating capacitor CDIFF stays at the zero value. A glitch or noise then occurs at the charge pump output CP OUT at time C3 which happens after time A3. The glitch or noise is reflected in the charge signal of differentiating capacitor CDIFF since first switch S1 is activated. However, the glitch or noise is not reflected in the charge signal of holding capacitor CH since second switch S2 is deactivated and is not activated until after the occurrence of the charge pump output CP OUT. At time B3 which occurs after time C3, first switch S1 has already been de-activated and second switch S2 is again activated. The charge level of holding capacitor CH then evens out to the zero level since no other instances of the charge pump output CP OUT occurs thereafter. Thus, glitches or noise are, in effect, filtered by having second switch S2 deactivated before and during the occurrences of charge pump output CP OUT and only activated to charge holding capacitor CH after the occurrences of charge pump output CP OUT. In other words, the output signal of proportional path circuit 310 is provided in response to integral path circuit 308 during a normal or generally non-noisy activity period (e.g., generally when no glitches or noise are present) of PFC 304 and is held off as being provided as an output signal during a noisy or glitch period of PFC 304, which, in effect, filters out the glitch(es) or noise.

The present invention discloses a loop filter device and method for a phase locked loop ("PLL") circuit, which locks a frequency of a signal to a reference frequency. The loop filter includes an integral path circuit and a proportional path circuit cascaded together in series and further includes a summer. The present invention reduces the noise and jitter in a PLL circuit. The present invention simplifies the components for the proportional path and integral path of a loop filter for a PLL circuit. The present invention also relieves circuit constraints and improves transient behavior for a loop filter of a PLL circuit.

The PLL circuit and method according to the present invention have been described in this specification in terms of a loop filter and a controlled oscillator handling current signals (e.g., current mode). The present invention is not in any way limited to being implemented or operated in a current mode. The present invention may also be described, implemented, and operated in terms of a voltage mode in which the PLL circuit and method utilize a loop filter and controlled oscillator handling voltage signals (e.g., voltage mode).

While the invention has been particularly shown and described with reference to a preferred embodiment, it will be understood by those skilled in the art that various changes in form and detail may be made therein without departing from the spirit and scope of the invention.

What is claimed is:

1. A loop filter for a phase locked loop ("PLL") circuit which locks a frequency of a signal to a reference frequency, comprising:
    an integral path circuit that receives an input signal and generates an integrated output signal for tracking an overall input signal level including proportional signals of prior input signals wherein the proportional signals are based on detected instantaneous phase differences for locking a frequency of a signal for a phase locked loop (PLL) circuit to a reference frequency;
    a proportional path circuit coupled in series with the integral path circuit wherein the proportional path circuit receives and differentiates the integrated output signal to provide a proportional output signal; and
    a summer that receives and sums the proportional output signal and the integrated output signal to provide a low-noise loop filter output signal.

2. The loop filter according to claim 1, wherein the integral path circuit further comprises:
    an amplifier; and
    an integrating capacitor coupled in parallel with the amplifier.

3. The loop filter according to claim 1, wherein the proportional path circuit further comprises:
    a differentiating capacitor;
    a first switch;
    a second switch; and
    a holding capacitor;
    wherein the differentiating capacitor and the second switch are coupled in series between the integral path circuit and the summer;
    wherein one end of the first switch is coupled between the differentiating capacitor and the second switch and another end of the first switch is coupled to ground; and
    wherein one end of the holding capacitor is coupled between the second switch and the summer and another end of the holding capacitor is coupled to ground.

4. The loop filter according to claim 3, wherein:
    the first switch is activated and the second switch is deactivated before and during an occurrence of a charge pump output to charge up the differentiating capacitor; and
    the first switch is deactivated and the second switch is activated only after the occurrence of the charge pump output to charge up the holding capacitor, which, in effect, filters out noise in the charge pump output.

5. The loop filter according to claim 4, wherein respective activation and de-activation of the first switch and the second switch are repeated for differentiating various integrated output signals to provide corresponding proportional output signals.

6. The loop filter according to claim 1, further comprising:
    a filter coupled to the low-noise loop filter output signal wherein the filter comprises a resistor and a capacitor coupled in series and between the low-noise loop filter output signal and ground.

7. The loop filter according to claim 1, wherein:
    the proportional path circuit holds off providing the proportional output signal as an output signal during a noisy period of a phase frequency comparator.

8. A method for implementing a loop filter for a phase locked loop ("PLL") circuit which locks a frequency of a signal to a reference frequency, comprising:
    receiving, by an integral path circuit, an input signal and generating, by the integral path circuit, an integrated output signal for tracking an overall input signal level including proportional signals of prior input signals wherein the proportional signals are based on detected instantaneous phase differences for locking a frequency of a signal for a phase locked loop (PLL) circuit to a reference frequency;
    receiving and differentiating, by a proportional path circuit coupled in series with the integral path circuit, the integrated output signal to provide a proportional output signal; and
    receiving and summing, by a summer, the proportional output signal and the integrated output signal to provide a low-noise loop filter output signal.

9. The method according to claim 8, further comprising:
    coupling an amplifier in parallel with an integrating capacitor to provide the integral path circuit.

10. The method according to claim 8, further comprising:
    providing a differentiating capacitor, a first switch, a second switch, and a holding capacitor for the proportional path circuit;
    coupling the differentiating capacitor and the second switch in series between the integral path circuit and the summer;
    coupling one end of the first switch between the differentiating capacitor and the second switch and another end of the first switch to ground; and
    coupling one end of the holding capacitor between the second switch and the summer and another end of the holding capacitor to ground.

11. The method according to claim 10, further comprising:
    activating the first switch and deactivating the second switch before and during an occurrence of a charge pump output to charge up the differentiating capacitor; and
    deactivating the first switch and activating the second switch after the occurrence of the charge pump output to charge up the holding capacitor, which, in effect, filters out noise in the charge pump output.

12. The method according to claim 11, further comprising:
repeating the respective activating and deactivating steps of the first switch and the second switch for differentiating various integrated output signals to provide corresponding proportional output signals.

13. The method according to claim 8, further comprising:
further filtering the low-noise loop filter output signal by coupling a resistor and a capacitor in series between the low-noise loop filter output signal and ground.

14. The method according to claim 8, further comprising:
holding off providing by the proportional path circuit the proportional output signal as an output signal during a noisy period of a phase frequency comparator.

15. A method for implementing a loop filter for a phase locked loop ("PLL") circuit which locks a frequency of a signal to a reference frequency, comprising:
integrating a loop filter input signal to provide an integrated signal that tracks an overall input signal level;
differentiating the integrated signal to provide a proportional signal based on a detected instantaneous phase difference for locking a frequency of a signal for a phase locked loop (PLL) circuit to a reference frequency; and
summing the integrated signal and the proportional signal to provide a low-noise loop filter output signal.

16. The method according to claim 15, wherein:
the integrating step is performed by an integral path circuit;
the differentiating step is performed by a proportional path circuit cascaded to the integral path circuit; and
the summing step is performed by a summer which receives as inputs the integrated signal and the proportional signal.

17. The method according to claim 16, further comprising:
coupling the integral path circuit, the proportional path circuit, and the summer in a single cascaded path.

18. The method according to claim 15, wherein the differentiating step further comprises:
differentiating the integrated signal by charging up a differentiating capacitor; and
coupling the differentiating capacitor to a holding capacitor wherein the holding capacitor is charged up only after the occurrence of a charge pump output, which, in effect, filters out noise in the charge pump output, and the holding capacitor holds the charge of the differentiating capacitor as the proportional signal being input into a summer.

19. The method according to claim 15, further comprising:
further filtering the low-noise loop filter output signal by coupling a resistor and a capacitor in series between the low-noise loop filter output signal and ground.

20. The method according to claim 15, further comprising:
holding off providing the proportional signal as an output signal during a noisy period of a phase frequency comparator.

21. A method of providing a proportional path signal for a loop filter of a phase locked loop circuit, comprising:
differentiating an integrated signal received from an integral path circuit of a loop filter of a phase locked loop circuit by utilizing and charging up a differentiating capacitor according to the integrated signal; and
delaying charging up a holding capacitor based on a charge of the differentiating capacitor until only after an occurrence of a charge pump output of the loop filter, which, in effect, filters out noise in the charge pump output.

* * * * *